(12) United States Patent
Huber et al.

(10) Patent No.: US 6,973,713 B1
(45) Date of Patent: Dec. 13, 2005

(54) APPARATUS AND SYSTEM FOR OPERATING AN AUTOMATIC COMPONENT MOUNTING UNIT FOR MOUNTING COMPONENTS ONTO A SUBSTRATE OF AN ELECTRICAL ASSEMBLY

(75) Inventors: Wolfgang Huber, Munich (DE); Mohammad Mehdianpour, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/559,886

(22) Filed: Apr. 26, 2000

(30) Foreign Application Priority Data

Apr. 30, 1999 (DE) ................................ 199 19 924

(51) Int. Cl.⁷ .......................... B23P 19/04; G06F 19/00
(52) U.S. Cl. ........................... 29/740; 29/739; 29/709; 29/832; 700/121; 700/176; 700/218
(58) Field of Search .................... 29/740, 741, 720, 29/721, 832, 833, 834, DIG. 44, 739, 743, 29/709; 700/218, 114, 121, 176, 193

(56) References Cited

U.S. PATENT DOCUMENTS

| | | | |
|---|---|---|---|
| 5,228,193 A * | 7/1993 | Yanagawa | 29/832 |
| 5,255,429 A | 10/1993 | Nishi et al. | |
| 5,285,946 A | 2/1994 | Tomigashi et al. | |
| 5,400,497 A | 3/1995 | Watanabe et al. | |
| 5,402,564 A * | 4/1995 | Tsukasaki | 29/832 |
| 5,456,001 A | 10/1995 | Mori et al. | |
| 5,515,600 A * | 5/1996 | Iwasaki | 29/740 |
| 5,537,204 A | 7/1996 | Woodhouse | |
| 5,588,195 A * | 12/1996 | Asai | 29/33 M |
| 5,692,292 A * | 12/1997 | Asai | 29/740 |
| 5,740,604 A * | 4/1998 | Kitamura | 29/832 |
| 5,741,114 A | 4/1998 | Onodera | |
| 6,002,650 A * | 12/1999 | Kuribayashi | 367/468.24 |
| 6,079,098 A * | 6/2000 | Soellner | 29/832 |
| 6,230,393 B1 * | 5/2001 | Hirano | 29/740 |

FOREIGN PATENT DOCUMENTS

| | | | |
|---|---|---|---|
| EP | 0 582 171 | 2/1994 | |
| JP | 405275898 | * 10/1993 | ................ 29/740 |
| WO | WO 92/22827 | 12/1992 | |
| WO | WO 97/37522 | 10/1997 | |
| WO | WO 98/37744 | 8/1998 | |

* cited by examiner

*Primary Examiner*—A. Dexter Tugbang
(74) *Attorney, Agent, or Firm*—Harness, Dickey & Pierce, P.L.C.

(57) ABSTRACT

A method, apparatus and system are for operating an automatic component mounting unit for mounting an electrical component onto a substrate of an electrical assembly. The automatic component mounting unit utilizes a number of different mounting members, such as a head, feeding and sensor members, for mounting a variety of different components. Each of the mounting members includes a data storage device. The automatic component mounting unit also includes a control device for communicating with a data storage device of each of the mounting members for processing an amount of process data that is specific to each of the mounting members and that is generated prior to installation. As a result, the mounting members are readily configured for optimal use upon installation of the mounting members.

18 Claims, 3 Drawing Sheets

APPARATUS AND SYSTEM FOR OPERATING AN AUTOMATIC COMPONENT MOUNTING UNIT FOR MOUNTING COMPONENTS ONTO A SUBSTRATE OF AN ELECTRICAL ASSEMBLY

BACKGROUND OF THE INVENTION

1. Field of the Invention

The invention relates to a method, apparatus and system for operating an automatic electrical component mounting unit that can be readily adapted to mount a variety of different electrical components by utilizing a number of different mounting unit members, such as a mounting head, feeding and sensor member.

2. Description of the Prior Art

It is generally known that automatic component mounting units are utilized to place or mount an electrical component onto a substrate of an electrical assembly. The component mounting unit utilizes a number of sensors to precisely and correctly determine where the components need to be positioned or placed onto the substrate. In this way, a control device of the automatic mounting unit can then communicate with the sensors in order to precisely control the movement of the mounting head member for mounting the component onto the substrate.

However, there exists a need in the art for an automatic mounting unit to be readily adaptable for mounting a variety of different components onto a variety of different substrates, thus, allowing for optimal flexibility within the component mounting operation. In order to meet this need, it is generally known that an automatic mounting unit is readily adapted by utilizing a variety of different mounting members, such as, the mounting head, feeding and sensor members. Each of the automatic mounting unit members are known to exist in a variety of different constructions that can be adapted for use in the mounting a number of different components and substrates that vary with respect to shape, size, or other like property.

For example, a mounting head member is constructed for accepting a number of components at the same time. In this way, a number of components can be mounted before the mounting head member is supplied with other components for mounting. As a result, the component mounting rate is effectively increased due to the optimal utilization of the mounting head member. In addition, a mounting head can also be constructed for accepting only one component at a time where the mounting rate is compromised for precision and control.

However, a problem in the art still exists in the downtime that is required to calibrate the automatic mounting unit after every adjustment or replacement of one or more of its member that is necessary to meet the varying component mounting process demands. With an increased downtime, the process automation is compromised.

U.S. Pat. No. 5,537,204 ("the '204 patent") attempts to address the component mounting unit calibration problem that was previously discussed. The '204 patent discloses a calibration method and apparatus that utilizes a glass plate or substrate. The glass plate is placed on a working station of a "pick-and-place" machine wherein the machine acts to place a glass slide onto the glass plate. The alignment or positioning of the glass slide relative to a reference marker on the glass substrate is then optically examined. The calibration measurements are then inputted into a control device for utilization during a subsequent mounting process. However, the calibration method of the '204 patent is substantially time intensive, that is, it takes approximately one to two hours.

SUMMARY OF THE INVENTION

An object of the present invention is to provide a method, apparatus and system for operating an automatic component mounting unit that has a number of different mounting members and that is readily calibrated for optimally mounting a variety of different components onto a variety of different substrates. The automatic mounting unit of the present invention utilizes a number of members, such as, the component mounting head, feeding and sensor members, that can be readily adapted to a variety of different components and substrates.

In an embodiment, each of the members of the component mounting unit includes a respective data storage device. The data storage device stores and processes data that relates to each of the respective mounting members. In this way, the data can be processed by a control device of the component mounting unit for utilization during every stage of the component mounting operation.

In an embodiment, the data storage device stores a variety of different process or characteristic data, such as, the geometrical or positioning data that has been measured relative to a fixed reference. This data can then be utilized for readily calibrating one or more of the automatic component mounting members virtually upon immediate installation. To accomplish this virtual real-time calibration, the control device communicates with the data storage device in order to configure the movement and positioning of the mounting member so that the mounting member is essentially ready for operation once it has been installed. In this way, the time-consuming calibration step subsequent to installation is effectively eliminated.

In an embodiment, the manufacturer identification codes of the different mounting members can be stored in the data storage device. This type of data is then processed by the control device for recognizing or identifying defective mounting members.

In a preferred embodiment, the functional or operational data of the mounting members is stored and processed by the control device via the data storage device for utilization during the component mounting operations. In this way, the control device can optimally control the operation of the component mounting members.

In an embodiment, the data exchange between the respective storage devices of each of the members and the control device occurs via electrical lines.

In an embodiment, a wireless data exchange occurs between the storage device and the control device. In this way, the process control equipment that is necessary for the operation of the automatic component mounting unit is minimized because additional electrical plug-connections are not required when a wireless data communication is utilized.

In a preferred embodiment, the mounting head member includes a number of holding elements, such as, suction pipettes or other like holding elements, in order to securely hold the component. Each of the suction pipettes includes a retracted and an extended position wherein the difference of the retracted and extended positions of each of the suction pipettes on the component mounting head can be calculated for purposes of calibrating the component mounting head for precise and controlled mounting of the component on the substrate.

In a preferred embodiment, the data storage devices include a transponder device, that is, a device that can process characteristic data, i.e. read and write data, in a contactless manner and that does not require its own energy supply. In addition, the transponder devices can be readily integrated within each of the mounting members.

In an embodiment, the component mounting member includes a component mounting head member, a component feeding member, a component sensor member or other like member. Each of the mounting members has a respective data storage device that stores process data which is specific to its respective mounting member. The process data varies with respect to the type of component that is to be mounted.

DETAILED DESCRIPTION OF THE PREFERRED EMBODIMENTS

Figure 1:
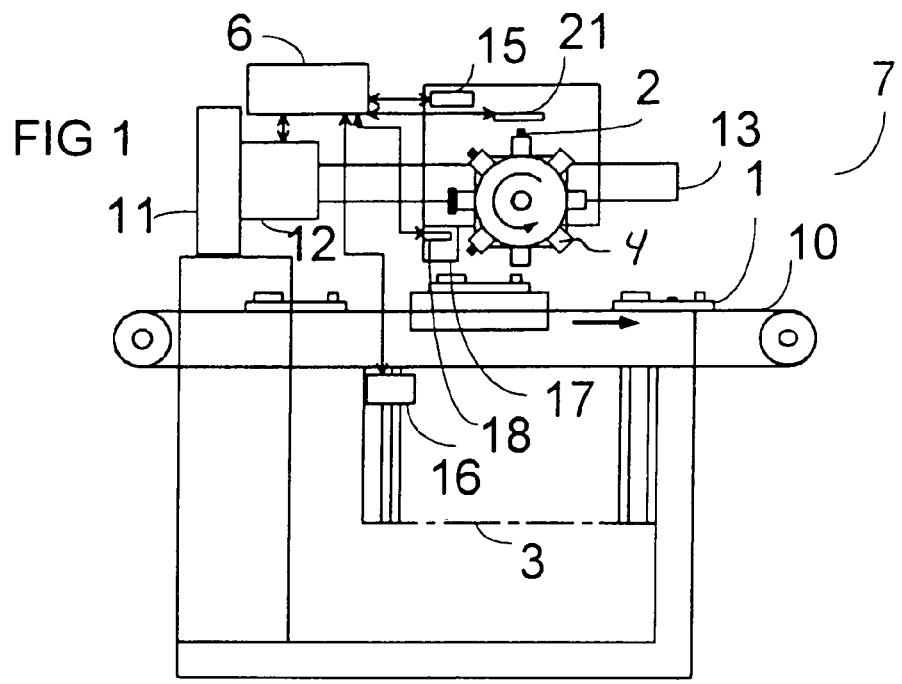
FIG. 1 is a schematic side view of an automatic component mounting unit.
Figure 2:
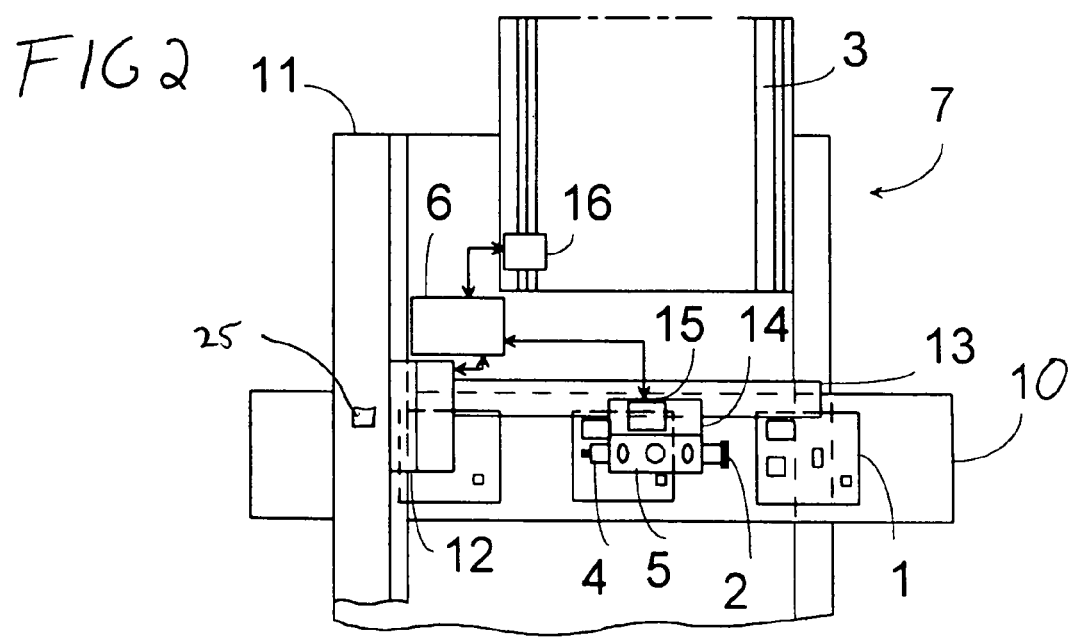
FIG. 2 is a schematic plan view of an automatic component mounting unit.

In FIGS. 1 and 2, an automatic component mounting unit 7 is illustrated that operates to mount a number of components 2 onto a respective substrate 1 as the substrate 1 moves along the conveying or transport mechanism 10. The automatic component mounting unit 7 includes a component mounting feeding member 3 that supplies the component mounting unit 7 with a number of components 2 for mounting. In addition, the component mounting unit 7 includes a component mounting head member 5 that has a number of holding elements, such as, suction pipettes 4, for accepting and securely holding the components 2 which are supplied from the feeding unit 3. Once the component mounting head member 5 receives the components 2, the components can then be transported to and placed onto a predetermined position of the substrate 1.

In order for the component mounting head member 5 to receive a component 2 from the feeding unit 3 and then to subsequently mount the component 2 onto the substrate 1, the component mounting head member 5 moves along a first bar 11 via a first carriage 12. The component mounting head member 5 then moves along a second bar 13 via a second carriage 14 in order for the component mounting head member 5 to mount the component 2 onto the substrate 1. The first 11 and second 13 bars are positioned perpendicular to one another.

Further, the automatic component mounting unit 7 includes a control device 6 for controlling the operation of the automatic component mounting unit 7. For example, the control device 6 controls the movement of the second carriage 14 towards the first carriage 12 for the precise and controlled delivery, transport and placing of the component 2 onto the substrate 1.

Prior to mounting the component 2 onto the substrate 1, a component camera 21 receives an image of the component 2 that is securely held by one of the suction pipettes 4 of the component mounting head member 5. The component camera 21 then transmits the image to the control device 6 which in turn processes the image and operates to control the motion of the component mounting head member 5 in order for the component 2 to be precisely placed or mounted on the substrate 1 in the predetermined or predescribed position.

The automatic component mounting unit 7 also includes a conveying or transport mechanism 10 which operates to transport or move the substrates 1 into a conveying position or path for the component mounting operation. A substrate camera 17 is positioned above the conveying mechanism 10 for determining the position of the substrate 1 relative to the component mounting head member 5. In this way, the position of the substrate 1 is also utilized to determine the correct positioning of the components 2 on the substrate 1.

The component mounting head member 5 includes a respective head data storage device 15 that stores process data regarding the component mounting head member 5. This data is then transmitted to and processed by the control device 6 via a wireless or hard wire communication. The head data storage device 15 can be integrated within the component mounting head member 5. In this way, the storage and processing of the component mounting head member process data can be transmitted in a contactless manner by a data processing unit, such as, a transponder device. Alternatively, the mounting head process data can be stored and processed on a data storage medium, such as a floppy disk or other like storage medium. The stored data can then be inputted and processed by a floppy disk drive of the control device 6 via the floppy disk.

The component feeding member 3 of the automatic component mounting unit 7 also includes a respective feeding storage device 16. In addition, the substrate camera 17 includes its own substrate camera storage device 18. The head, feeding, and substrate camera storage devices contain characteristic data that relates to the component mounting head member, the component mounting feeding member 3 and the substrate camera 17, respectively. In this way, the data of each of these members of the automatic component mounting unit can be readily transmitted to the control device 6 during the component mounting operation. The control device 6 utilizes this data for controlling the precise and controlled mounting of the components 2 onto the substrate 1.

Figure 3:
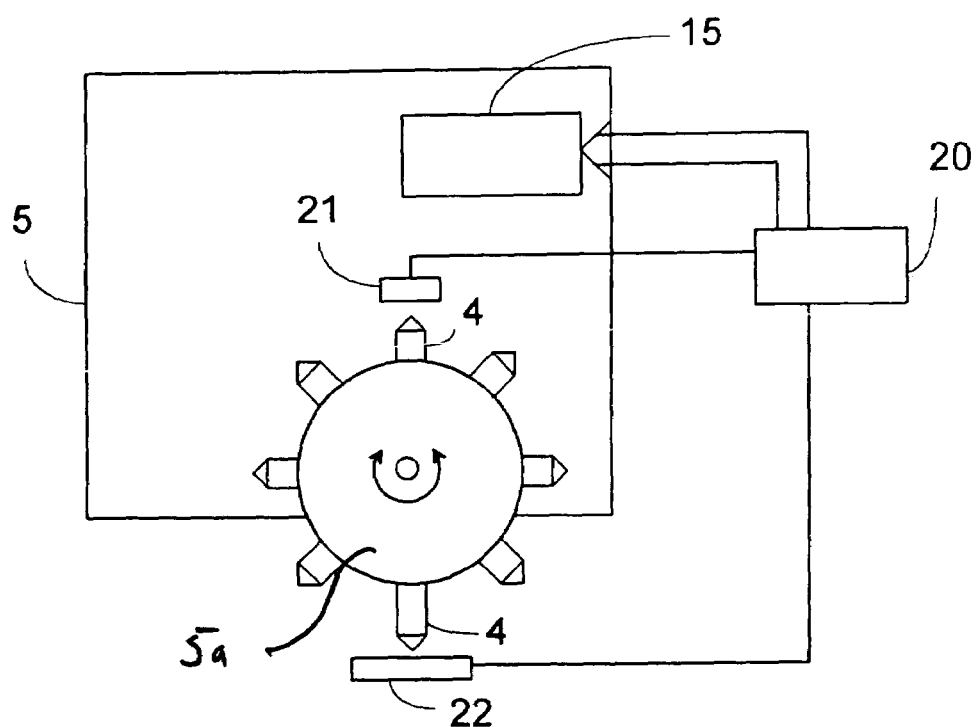
FIG. 3 is a schematic side view of a component mounting head member wherein process data that is specific to the component mounting head is measured prior to installation.

In FIG. 3, the characteristic data of the component mounting head member 5 is stored on the respective head data storage device 15 prior to the installation of the component mounting head member 5 onto the automatic component mounting unit 7. The component mounting head member 5 preferably includes a turret head 5a that has a total of eight suction pipettes 4. Each of the suction pipettes 4 are attached along the circumference of the of the turret head 5a of the component mounting head member 5. In order to store the characteristic or process data of the component mounting head member 5, the component mounting head member 5 is moved into a testing stand prior to the final installation. In the testing stand, the extended position of the first suction pipette 4 is subsequently optically measured by a stationary camera 22. The extended position essentially corresponds to the position of the suction pipette 4 when the component 2 is mounted onto the substrate 1. Next, the retracted position of the first suction pipette 4 is measured by the component camera 21. The retracted position essentially corresponds to the position of the suction pipette during the transport or movement of the component 2 from the feeding unit 3 to the substrate 1 via the component mounting head member 5. The difference between the measurements of the retracted and extended position of the first suction pipette 4 is then evaluated by a testing control device 20. This process is repeated for all of the 7 other suction pipettes 4 wherein any deviation of the measurements of any of the other 7 suction pipettes relative to the measurements of the first suction pipette is recorded by the testing control device 20 and is then subsequently stored in the head data storage device 15. After installation of the component mounting head member 5 onto the automatic component mounting unit 7, it is therefore only necessary to determine the positioning of the first suction pipette 4 at the retraction and extension positions in a known way. As a result, the positioning parameters, i.e., the retraction position, the extension position and differences thereof, are known if the component mounting head member 5 is connected to the automatic mounting unit 7 via a highly-precise mechanical interface whose reference mark with respect to the automatic mounting unit is known or are optically measured by utilizing stationary sensors and a reference material, such as a glass substrate with a glass component.

Once the positioning parameters of the first suction pipette 4 are determined and stored, the head storage device 15 then transmits this positioning data of the first suction pipette 4, along with the data of all the other suction pipettes, to the control device 6 wherein the data can then be processed. The automatic component mounting unit 7 can then calculate the positioning of the seven other suction pipettes relative to the positioning of the first suction pipette 4 based on the positioning parameter data of the first suction pipette 4 that was generated as previously discussed.

However, the present invention is not limited by utilizing the first suction pipette 4 as a reference to determine the positioning of the other suction pipettes. Other fixed reference marks can also be selected whose precise position relative to the automatic component mounting unit 7 is known or can be simply measured. Therefore, the fixed reference mark data 25 of the automatic component mounting unit 7 can be utilized to calibrate the positioning of the suction pipettes 4 of the component head mounting member as well as the positioning of other mounting members. In this way, the positioning data can be stored within the data storage device of each of the respective mounting members wherein this data can be transmitted to the control device 6 for utilization during the mounting operation.

Figure 4:
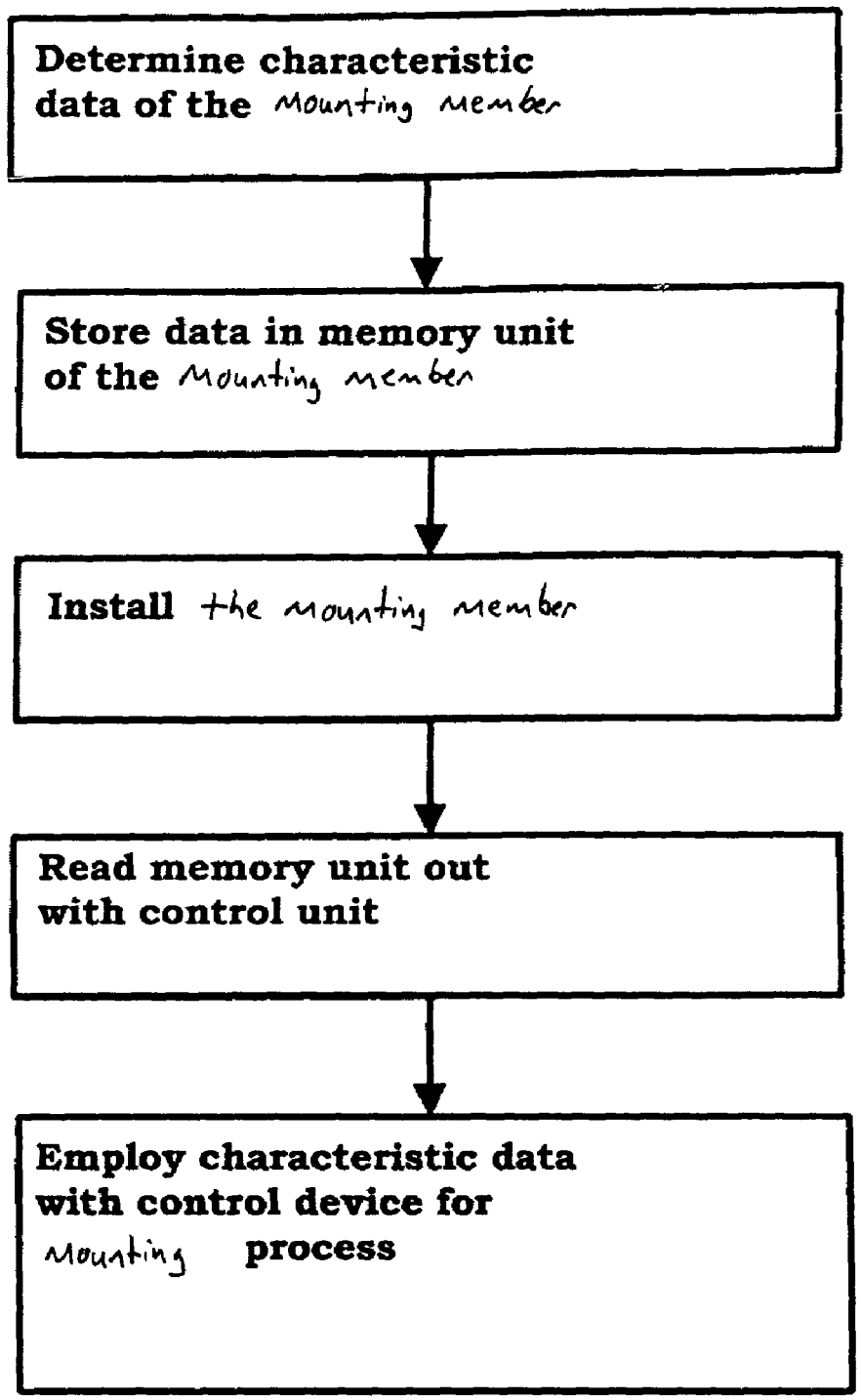
FIG. 4 is a flow chart of the method for operating the automatic component mounting unit.

In FIG. 4, the operation of the automatic component mounting unit 7 is demonstrated in a flow chart. First, the characteristic or process data of each of the members of the automatic component mounting unit 7, such as, the component mounting head 5, feeding 3, and substrate camera 17 are initially determined. The characteristic data can include geometrical, positioning, manufacturer identification, functional, operational, or other like mounting process data that is specific to each of the mounting members. The characteristic data of each of the members is then stored in each of the mounting member's respective storage device such as the head 15, feeding 16 and substrate 18 storage devices. The mounting members are then installed wherein the process data is transmitted to the control device 6. The control device 6 then utilizes this data for controlling the mounting operation. As a result, the mounting members can be readily adapted for optimal use essentially upon immediate installation of the mounting members.

Although modifications and changes may be suggested by those skilled in the art, it is the intention of the inventors to embody within the patent warranted hereon all changes and modifications as reasonably and properly come within the scope of their contribution to the art.

What is claimed is:

1. An automatic component mounting unit for mounting an electrical component onto a substrate of an electrical assembly, comprising:
   a plurality of mounting members disposed for mounting said electrical component, each of said mounting members including a respective data storage device, wherein each of said data storage devices stores position data of said mounting member relative to a fixed reference mark; and
   a control device disposed for controlling said automatic component mounting unit, each of said data storage devices transmitting said position data to said control device, wherein said position data is utilized so as to adapt each of said mounting members for optimal use during said mounting of said electrical component.

2. An automatic component mounting unit according to claim 1 wherein each of said data storage devices includes a transponder unit for communicating with said control device in a contactless manner, and wherein said transponder unit is directly attached to each of said mounting members.

3. An automatic mounting unit according to claim 1 wherein said mounting members include a mounting head member.

4. An automatic mounting unit according to claim 1 wherein said mounting members include a mounting feeding member.

5. An automatic mounting unit according to claim 1 wherein said mounting members include a mounting sensor member.

6. A system for operating an automatic component mounting unit for mounting an electrical component onto a substrate of an electrical assembly, comprising:
   a plurality of mounting members installed for mounting said electrical component, wherein each of said mounting members includes a respective data storage device for storing position data of said mounting member relative to a fixed reference mark; and
   a control device disposed for communicating with each of said data storage devices for processing said position data, wherein said control device utilizes said position data so as to readily adapt each of said mounting members for optimal use upon installation of each of said mounting members to said automatic component mounting unit.

7. An automatic component mounting unit according to claim 1, wherein said control device receives said position data to configure movement and positioning of the plurality of mounting members.

8. A system as claimed in claim 6, wherein said control device receives said position data to configure movement and positioning of the plurality of mounting members.

9. An automatic component mounting unit for mounting an electrical component onto a substrate, comprising:
   a plurality of mounting members disposed for mounting an electrical component, wherein each of said mounting members includes a respective data storage device, adapted to store position data of said mounting member relative to a fixed reference mark; and
   a control device, adapted to control said plurality of mounting members, wherein the position data is utilized by the control device so as to adapt each of the mounting members for optimal use during the mounting of an electrical component.

10. The automatic component mounting unit of claim 9, further comprising a mounting head member, including the plurality of mounting members.

11. The automatic component mounting unit of claim 10, wherein the mounting head member includes a storage device for storing the position data.

12. The automatic component mounting unit of claim 11, wherein the storage device is a transponder, adapted to communicate with the control device in a contactless manner.

13. The automatic component mounting unit of claim 10, wherein the position data is stored on a data storage medium, insertable into at least one of the mounting head member and the control device.

14. An automatic component mounting unit according to claim 13, wherein said control device receives said position data to configure movement and positioning of the plurality of mounting members.

15. The automatic component mounting unit of claim 9, wherein the position data is transferred from a data storage medium.

16. The automatic component mounting unit of claim 9, wherein the position data is stored on a data storage medium, insertable into the control device.

17. An automatic component mounting unit according to claim 9, wherein said control device receives said position data to configure movement and positioning of the plurality of mounting members.

18. An automatic component mounting unit comprising:
   a plurality of mounting members for mounting an electrical component on a substrate;
   each of said mounting members respectively including data storage means for storing position data of said mounting member relative to a fixed reference mark; and
   a control device for receiving said position data from said data storage means.

* * * * *